United States Patent [19]
Cohen

[11] Patent Number: 5,270,251
[45] Date of Patent: Dec. 14, 1993

[54] INCOHERENT RADIATION REGULATED VOLTAGE PROGRAMMABLE LINK

[75] Inventor: Simon S. Cohen, Burlington, Mass.

[73] Assignee: Massachusetts Institute of Technology, Cambridge, Mass.

[21] Appl. No.: 22,980

[22] Filed: Feb. 25, 1993

[51] Int. Cl.⁵ .......................................... H01L 21/268
[52] U.S. Cl. .................................... 437/173; 437/922; 437/942
[58] Field of Search ................. 437/19, 173, 174, 183, 437/922, 942; 148/DIG. 1, DIG. 4, DIG. 55

[56] References Cited

U.S. PATENT DOCUMENTS

| | | | |
|---|---|---|---|
| 4,585,490 | 4/1986 | Raffel et al. | 437/199 |
| 4,810,663 | 3/1989 | Raffel et al. | 437/19 |
| 4,823,181 | 4/1989 | Mohsen et al. | 257/640 |
| 4,943,538 | 7/1990 | Mohsen et al. | 437/922 |
| 5,070,384 | 12/1991 | McCollum et al. | 437/193 |
| 5,166,556 | 11/1992 | Hsu et al. | 437/922 |
| 5,171,715 | 12/1992 | Husher et al. | 437/922 |
| 5,185,291 | 2/1993 | Fischer et al. | 437/173 |

OTHER PUBLICATIONS

Cohen, Simon et al., "A Novel Double-Metal Structure For Voltage-Programmable Links," *IEEE Electron Device Letters*, vol. 13, No. 9, Sep. 1992, pp. 488–490.

*Primary Examiner*—Brian E. Hearn
*Assistant Examiner*—C. Chaudhari
*Attorney, Agent, or Firm*—Hamilton, Brook, Smith & Reynolds

[57] ABSTRACT

The present invention discloses an incoherent radiation regulated voltage programmable link circuit and a method for making the circuit. The voltage programmable link circuit lowers the programming voltage of the link to that of the normal operating voltage by applying electromagnetic radiation to the link structure. The radiation may be radio frequency radiation, or ultraviolet radiation may be applied through a transparent conductive element.

23 Claims, 3 Drawing Sheets

INCOHERENT RADIATION REGULATED VOLTAGE PROGRAMMABLE LINK

The U.S. Government has rights in this invention pursuant to Contract Number F19628-90-C-0002 awarded by the Department of the Air Force.

BACKGROUND OF THE INVENTION

This invention is related generally to solid state integrated circuit fabrication and, more particularly, to methods for fabricating voltage programmable link structures.

Programmable conductive paths, particularly links between two or more distinct conductive layers, are increasingly employed in solid state integrated circuit fabrication to produce a wide variety of programmable circuits including, for example, field programmable gate arrays (FPGAs), programmable read only memories (PROMs), and other programmable electronic devices. Typically, these devices are "programmed" by applying an electrical voltage to trigger an "antifuse" link structure of two conductive layers separated by an insulator. An electrical connection is established between the conductive layers by breaking down the insulator at selected regions with a current developed by the programming voltage.

One way to implement an antifuse voltage programmable link structure is to use two levels of flat metallization agents and a composite insulator made of a deposited silicon oxide film interposed between two like films of silicon nitride. The insulator films are typically each about 100 Å (10 nm) thick and require programming voltage of about 12 volts utilizing a 1 ms pulse. The normal operating voltage for this voltage programmable link structure without affecting the integrity of the unprogrammed links is about 5 volts. Such a link structure is presented in prior application, PCT/US92/06138, filed Jul. 22, 1992.

SUMMARY OF THE INVENTION

The present invention provides a voltage programmable link structure and a method for fabricating the link so that it breaks down with programming voltages that approximate the normal operating voltage without disturbing the existing circuits or establishing unintended circuits. Furthermore, this structure does not take up a large amount of chip area or require complex processing for implementation. The present invention regulates the programming voltage of the voltage programmable link to near its normal operating voltage by using incoherent electromagnetic radiation, preferably in the form of ultraviolet (UV) light or radio frequency (RF) radiation, over a wide area to excite components of the voltage programmable structure. This electromagnetic energy is absorbed by the insulator, altering its internal structure. This causes the leakage current to increase, accelerating the breakdown at a substantially lower programming voltage applied to selected links.

In accordance with one embodiment of the present invention, there is provided a method of producing a voltage programmable link structure that includes a first conductive element, such as aluminum, formed over a substrate. A transformable insulator material is formed over the first conductive element. The preferred transformable insulator includes a silicon oxide layer interposed between silicon nitride layers. A second conductive element is formed over the transformable insulator material.

At least one conductive path is formed when a voltage is selectively applied between the first and second conductive elements across the transformable insulator material. In the preferred embodiment, a programming voltage of less than 6 volts gradually stresses the insulator material until a filament develops between the first and second conductive elements. As the filament develops, electrons (excited by the electromagnetic radiation) from the first conductive element move to the second conductive element. The filament eventually collapses causing the electrons in the first conductive element to accelerate towards the positively biased second conductive element.

Different sources of radiation may be used to reduce the threshold breakdown voltage. By providing a transparent top conductive element, incoherent light may be applied to the structure to cause a photoelectric effect. In that case, it is believed that the light, particularly ultraviolet radiation, excites electron in the nitride layer so that layer becomes conductive. The applied voltage is thus experienced entirely by the remaining insulating layers, and the breakdown voltage is reduced. In the case of radio frequency radiation, a transparent electrode is not required. In this case, it is believed that there is resonant absorption of the radio frequency energy in the capacitor formed by the structure, and that absorption results in the lower breakdown voltage.

The preferred structure comprises nitride/oxide/nitride layers of approximately 10 nm each. In such a structure, breakdown of the link structure has been found to occur as a 6 volt pulse or below is applied for about 1 msec. If the link structure is not subjected to incoherent electromagnetic radiation, no special effect occurs. Thus, without incoherent electromagnetic radiation, a higher programming voltage (i.e., about 14 volts) would be required to break down the insulator material for establishing a link between the first and second conductive elements.

While the present invention will hereinafter be described in connection with a preferred embodiment and method of producing, it will be understood that it is not intended to limit the invention to these embodiments. Instead, it is intended to cover all alternatives, modifications and equivalents as may be included within the spirit and scope of the present invention as defined by the appended claims.

DETAILED DESCRIPTION OF THE INVENTION

Figure 1:
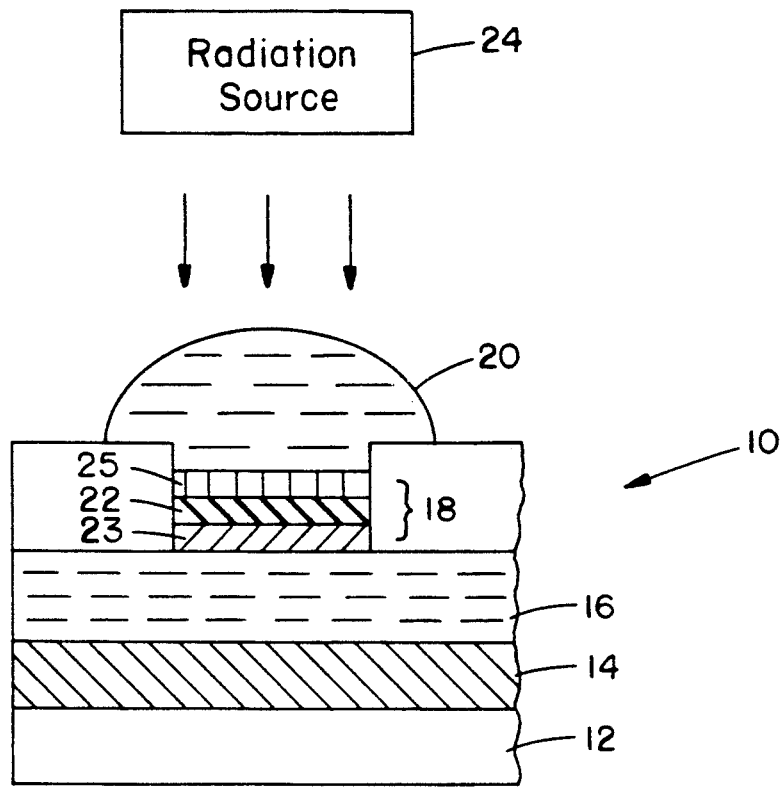
FIG. 1 is a sectional view of a voltage programmable link structure according to the present invention.

An RF irradiated embodiment of the invention is first described. In FIG. 1, a voltage programmable link structure 10 of the present invention is shown formed upon a silicon substrate 12 (which can be a field insulator or an active device layer of an integrated circuit wafer). The link 10 further includes a field oxide layer 14 deposited over the substrate, a first metallization layer (M1) 16 deposited over the field oxide layer, a transformable insulator link material 18 deposited over the first metal layer, and a second metallization layer (M2) 20 deposited over the transformable insulator material.

The first metallization layer 16 is preferably formed by depositing an aluminum layer (e.g., less than about 1 mm) on the field oxide layer 14. The aluminum layer is followed with a thin layer of titanium (e.g., less than about 200 Å). The titanium layer is followed by another layer of aluminum (e.g., less than about 200 Å). The first metal is formed by sintering the above layers together.

Once the first metal layer 16 has been formed, it is overlaid with the transformable link insulator material 18 at each programmable link site. The link insulator material is preferably a silicon oxide insulator 22 having silicon nitride layers 23 and 25 to physically separate it from the first and second conductive metals. In the preferred embodiment, the silicon nitride layers sandwich the silicon oxide layer to protect it from the metallization layers 16 and 20. This minimizes the chance of chemical reactions degrading the structure 10 over time. The silicon oxide layer and the bottom silicon nitride layer 23 each have a thickness ranging from about 50 Å to about 120 Å. Preferably, the silicon oxide layer is about 75 Å and the bottom silicon nitride layer is about 75 Å. The top silicon nitride layer 25 has a thickness that ranges from about 70–120 Å. Preferably, the silicon nitride layer is formed from a silicon-rich silicon nitride with a thickness of about 75 Å. The thickness of each insulator layer ensures that the insulator material becomes conductive as a voltage is applied and forms a link between the first metal element and the second metal element.

The above link insulator components are preferably formed by using a low temperature (e.g., 300–400° C.) plasma enhanced chemical vapor deposition (PECVD) rather than thermal growth or high-temperature (e.g., 700° C.) chemical vapor deposition (CVD). PECVD is a highly controllable process that permits the silicon oxide layer to be formed between the silicon nitride layers. PECVD oxide and nitride layers allow the use of a thicker insulating layer thereby reducing parasitic capacitances while still retaining a low programming voltage. Also, since PECVD is performed with relatively low temperatures, aluminum can be used as a conductive element, as opposed to conductors that have higher resistances and melting points such as polysilicon. After the formation of the transformable insulator material, the second conductive element 20 is deposited. The second conductive element like the first conductive element is formed by depositing an aluminum layer (e.g., less than about 200 Å), a thin layer of titanium (e.g., less than about 200 Å) and another layer of aluminum (e.g. less than about 10,000 Å).

The programming voltage for the voltage programmable link structure 10 is regulated by applying electromagnetic radiation generated from a radiation source 24 positioned over the second conductive element. In this embodiment, the radiation is radio frequency radiation, particularly in the range of 0.5 MHz to 1.6 MHz though it may be any frequency including microwave frequencies. The radiation covers a wide area of plural link structures, individual ones of those link structures being selectively transformed by an applied voltage.

The RF incoherent electromagnetic radiation induces an electromagnetic field in the voltage programmable link structure 10 which alters the transformable insulator material 18. It is believed that the insulator is altered because the induced RF electromagnetic radiation causes resonant absorption of the field's energy within the link structure. The absorbed energy is believed to occur primarily in the silicon nitride layers 23 and 25 because these layers are lossy in nature and permit dissipation of the induced electromagnetic field. The absorption results in a premature breakdown of the insulator material 18 with a lower programming voltage. In the present invention, a preferred programming voltage of less than six volts causes electrons in the first conductive element 16 to accelerate towards the second conductive element 20 until a permanent link is established between the first and second conductive elements.

Figure 2:
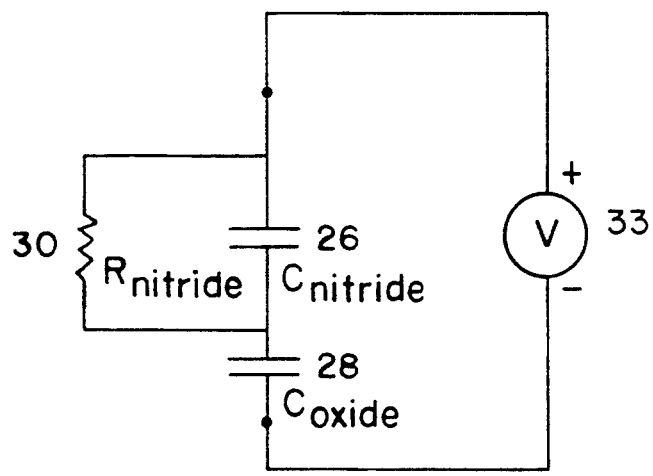
FIG. 2 is a circuit equivalent modeling the voltage programmable link. As depicted here, the nitride component of the capacitor may be shunted by the resistor, $R_{nitride}$.

The effect of the RF incoherent electromagnetic radiation on the voltage programmable link structure is illustrated by the equivalent circuit schematic shown in FIG. 2. In FIG. 2, there is an auxiliary source 33 supplying voltage to capacitors 26 and 28 which are connected in series and are shunted by resistor 30. Capacitor 26 represents the capacitance of the silicon nitride layers 23 and 25, and capacitor 28 represents the capacitor formed across the silicon oxide layer 22. Resistor 30 represents the resistance of lossy nitride films owing to the absorption of the field's energy. In this particular circuit, electromagnetic radiation operating under low frequency conditions (e.g., below about 5 MHz) causes the nitride capacitor 26 to be shunted by resistor 30 so that the only remaining component is the capacitor 28.

Thus, by applying the low frequency signal to the metal insulator metal structure, the breakdown voltage can be lowered by at least as much as that due to the two nitride components. Since under such conditions the system is represented at best by only the oxide capacitor, its breakdown field will become the dominant factor determining the voltage programmable link writing voltage.

Figure 3A:
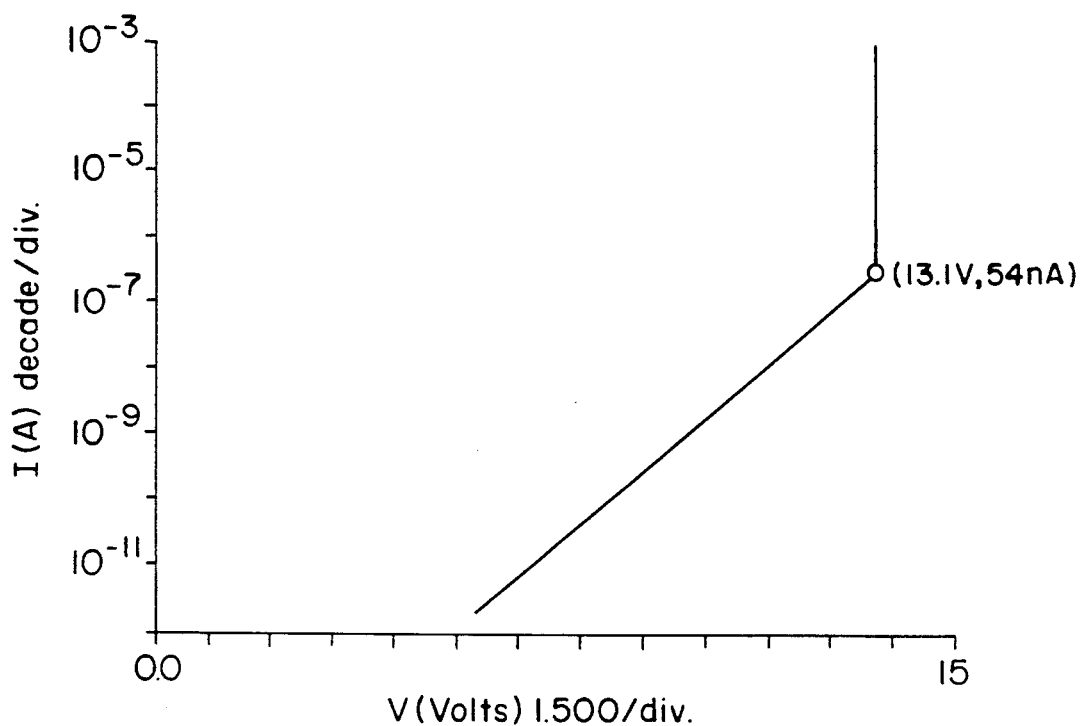
FIGS. 3A-3B are Current (I) versus Voltage (V) plots for the voltage programmable link structure with and without electromagnetic radiation.
Figure 3B:
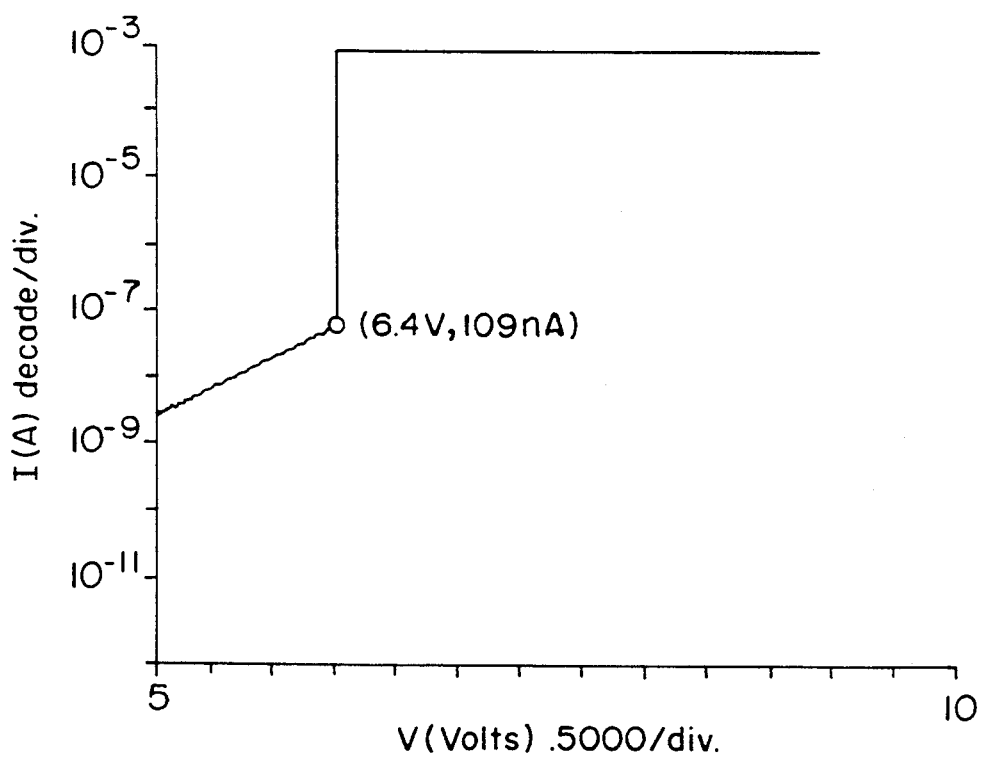

FIGS. 3A–3B show current-voltage characteristics for the voltage programmable link structure of the present invention where the radiation source is on and off. In FIG. 3A, the radiation source 24 is off and the link structure begins to form a filament in the insulator for a programming voltage of 13.1 volts and a current of 54 nA. Eventually, as the current is increased, the filament develops further until there is a link between the first and second conductive elements. On the other hand, when the radiation source has been applied, the link structure begins to form a filament in the insulator for a programming voltage of about 6.4 volts and a current of 109 nA. Eventually, as the current is increased, the filament develops further until there is a link between the first and second conductive elements. Although this plot shows a programming voltage of 6.4 volts, a link can be established for programming voltages of less than 6 volts.

Figure 4:
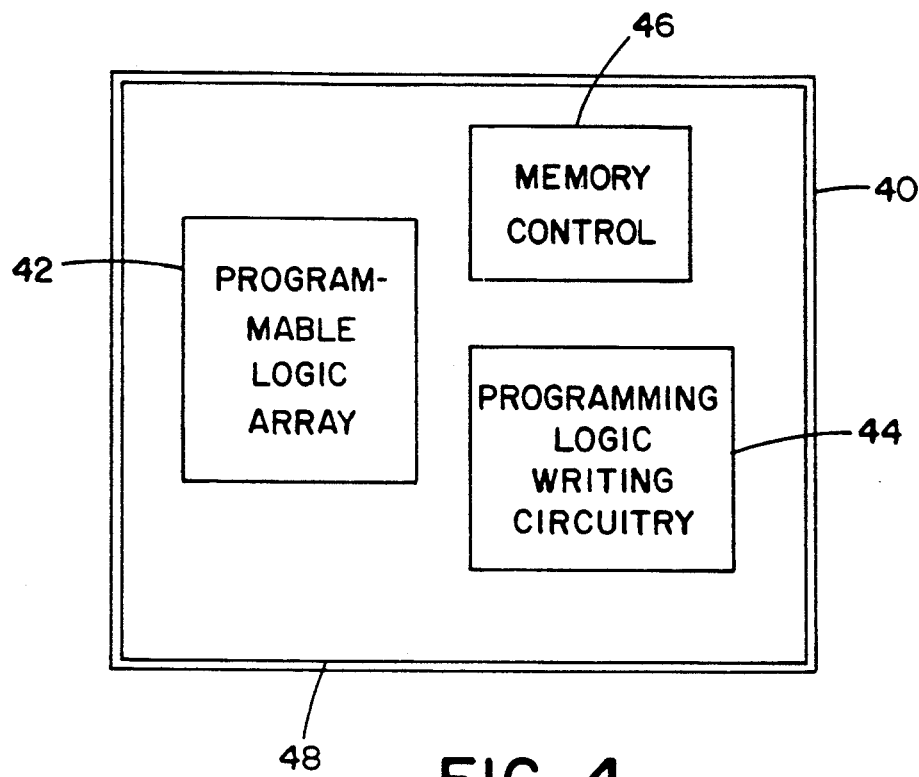
FIG. 4 is a block diagram showing the voltage programmable link structure embodied in an integrated circuit.

FIG. 4 shows a block diagram of the voltage programmable link structure embodied in an integrated circuit read only memory 40. The integrated circuit includes a programmable logic array 42 of voltage programmable link structures 10, each having a transformable insulator interposed between conductive elements. The link structures of the programmable logic array are programmed by electronic programming logic circuitry 44. After programming, the memory array of link structures is accessed in conventional fashion by memory control 46.

In accordance with the present invention, links that have been irradiated by the radiation source 24 break down at programming voltages that are substantially less than their normal threshold voltage. In this embodiment, the programming voltage for irradiated links is less than 6 volts. The normal threshold voltage for links that have not been irradiated is about 14 volts. In a typical programmable link circuit the programming logic 44 would be required to operate at 14 volts or higher. However, with the present invention conventional 5 volt circuitry may be used in the logic 44. After programming, as an added protective feature to prevent accidental programming, the integrated circuit is provided with packaging layer 48 such as an opaque faraday cage. The packaging layer blocks further radiation from reducing the threshold voltage during normal operation.

In the device tested, the first conductive element was a large sheet which covered the entire chip. Thus it served as a large antenna which could absorb a weak RF signal. The chip may be designed so that it does not have such an antenna structure during normal operation but be provided with an antenna which can be switched on for the programming of the chip. The antenna may be fabricated on the chip itself or merely placed next to the chip during programming. For example, the antenna could be a meandering conductor on the chip.

Figure 5:
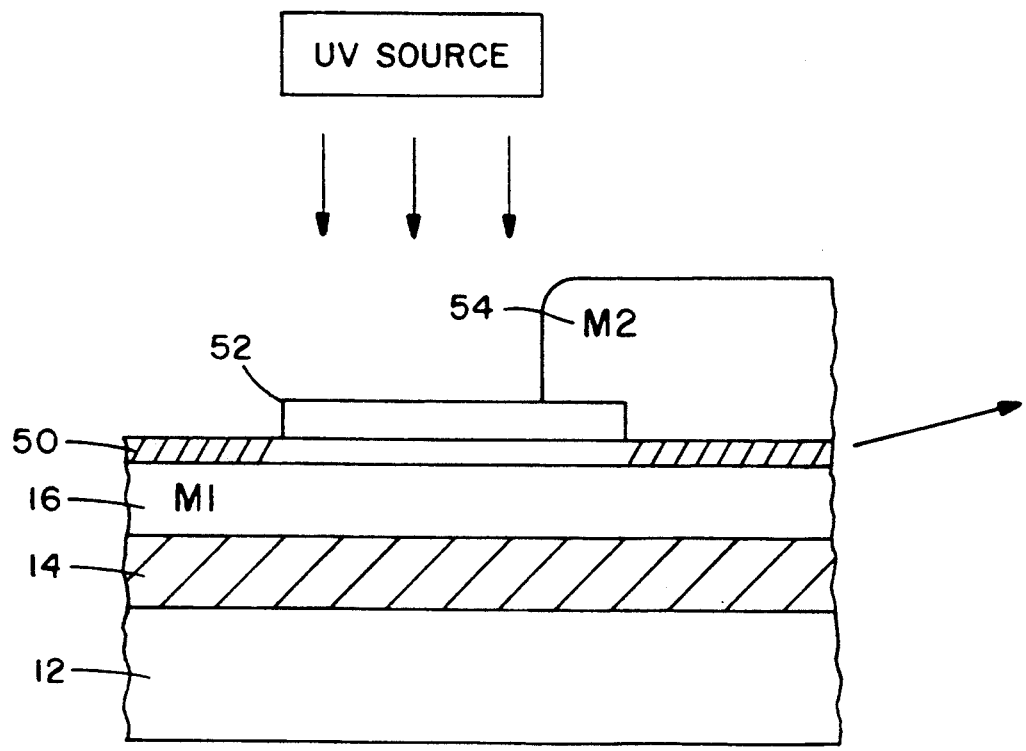
FIG. 5 illustrates an alternative embodiment responsive to light radiation.

As an alternative to RF radiation, the breakdown threshold voltage may be reduced by light radiation, preferably ultraviolet radiation. The quantum energy of ultraviolet radiation matches that required to excite electrons in the insulator films. As illustrated in FIG. 5, the link structure is substantially the same as that previously presented in that it includes a substrate 12, a field oxide 14, and a first metal layer 16. Further, it includes a composite insulator 50 and a top conductive element 52. However, the present embodiment is modified in order to assure a photoelectric effect in the composite insulator 50 and to make the top conductive element 52 transparent. An additional nontransparent metal layer 54 may be connected to the element 52 from the side to provide high current carrying capacity to the transformable link.

As before, the first metallization agent utilizes the concept of flat-aluminum and the main dielectric insulator is a deposited oxide about 5-7 nm thick. This film follows the deposition of similar nitride film. The combined thickness of these two films is typically in the range of 10-15 nm. The breakdown voltage for such a film is designed to be about 8V. The oxide film is next topped by a much thicker photosensitive material, such as provided by amorphous silicon, silicon-rich silicon nitride, or any other suitable material. The thickness of this layer is such that its own breakdown voltage should be in the range of 5-7V. for example, silicon-rich silicon nitride which is utilized in existing structures has a breakdown field of about 3MV/cm. Hence, a 20 nm film of this material should have a breakdown voltage of about 6V. Finally, the structure is completed by depositing the top electrode. A transparent top electrode 52 facilitates the photo-assisted process. This can be made by depositing a suitable conducting material such as tin oxide or titanium oxide, or grown insitu by depositing a thin film of titanium over yet another film of oxide and promoting a controlled thermal reaction between these two substances to yield the desired transparent conductor. Yet another possibility is to use extremely thin films of aluminum, below about 20 nm, which are known to be transparent. Any of these conducting films would then be connected to a normally thick upper electrode 54.

The mechanism by which the new structure operates is the following. In darkness no special effect is present and the high voltage of about 14V is required in order to break down the insulator and form the desired link. As explained above, this writing voltage is made of the individual breakdown voltage contributions of the three insulator components. Under suitable lighting conditions, and in the presence of an adequate bias, say 5V, at least the top photosensitive film turns into a conductor (highly leaking insulator). The light excites electrons in this material which are accelerated towards the top (positively) biased electrode. When this conduction is taking place, essentially all of the applied bias of 5V is experienced by the bottom members of the insulator. If these are made to break down under such a bias, linking of the two metal electrodes will take place as in usual devices.

While the present invention ha been particularly described in conjunction with preferred embodiments and methods of use, it will be understood that it is not intended to limit the invention to these embodiments. Instead, it is intended to cover all alternatives, modifications, and variations which will be apparent to those skilled in the art without departing from the spirit and scope of the present invention as defined by the appended claims.

The terms first and second metallization layers are used herein to distinguish between lower and upper metallization layers. It should be clear that the first metallization layer need not be the first or lowest conductive path in the integrated circuit. Likewise, the second layer need not be the second metallization layer or the highest conductive path in the integrated circuit. There may be other metallization layers that do not enter into the programmable link.

Moreover, the invention can be practiced to establish links between more than two conductive layers, the term first and second being shorthand expressions for the top and bottom of the conductive path, respectively. Likewise, the term substrate is used herein to describe various levels which lie below the first metallization layer, including the bulk silicon of the wafer, active devices (e.g., sources, gates and/or train regions), gate oxide layers and other structures as the case may be. It should also be appreciated that the link structures and methods of the present invention need not be limited to silicon based devices, but rather can also find application in other semiconductor devices, such as gallium arsenide structures and the like.

Furthermore, the present invention can be practiced with an inductor or ballast wrapped around the link structure to generate an electromagnetic field in the link structure.

I claim:

1. A method of producing and programming an electrically programmable link structure comprising the steps of:

forming a first conductive element on a substrate;
forming a transformable insulator material over the first conductive element;
forming a second conductive element over the transformable insulator; and
emitting incoherent electromagnetic radiation over an area which is large relative to a link structure to lower breakdown voltage threshold of the transformable insulator material while selectively applying a programming voltage which is substantially less than normal breakdown voltage threshold without radiation to transform the insulator material to form a conductive link.

2. A method of producing an electrically programmable link structure according to claim 1, wherein the programming voltage is about 6 volts or less.

3. A method of producing an electrically programmable link structure according to claim 1, wherein the first and second conductive elements are formed of aluminum and titanium.

4. A method of producing an electrically programmable link structure according to claim 1, wherein the step of forming a transformable insulator material further comprises forming a multilayer structure comprising a silicon oxide layer and at least one silicon nitride layer.

5. A method of producing an electrically programmable link structure according to claim 1, wherein the transformable insulator comprises a layer of amorphous silicon.

6. A method of producing an electrically programmable link structure according to claim 1, wherein the transformable insulator comprises at least one silicon oxide layer of silicon-rich silicon oxide.

7. A method of producing an electrically programmable link structure according to claim 1, wherein the second conductive element is transparent and the electromagnetic radiation is light radiation.

8. A method of producing an electrically programmable link structure according to claim 1, wherein the emitted electromagnetic radiation is ultraviolet light.

9. A method of producing an electrically programmable link structure according to claim 1, wherein the emitted electromagnetic radiation has a radio wave frequency.

10. A method of producing an electrically programmable link structure comprising the steps of:
forming a first conductive element on a substrate;
forming a transformable insulator material over the first conductive element, the transformable insulator material comprising a silicon oxide layer interposed between silicon nitride layers;
forming a second conductive element over the transformable insulator material; and
emitting electromagnetic radiation over an area which is large relative to a link structure to lower a breakdown voltage threshold of the transformable insulator material while- selectively applying a programming voltage which is substantially less than normal breakdown voltage threshold without radiation between the first and second conductive elements across the transformable insulator material to form a conductive link.

11. A method of producing an electrically programmable link structure according to claim 10, wherein the programming voltage is about 6 volts or less.

12. A method of producing an electrically programmable link structure according to claim 10, wherein the second conductive element is transparent and the electromagnetic radiation is light radiation.

13. A method of producing an electrically programmable link structure according to claim 10, wherein the emitted electromagnetic radiation is ultraviolet light.

14. A method of producing an electrically programmable link structure according to claim 10, wherein the emitted electromagnetic radiation has a radio wave frequency.

15. A method of programming an integrated circuit of programmable link structures comprising the steps of:
emitting electromagnetic radiation over plural link structures of the integrated circuit to lower breakdown voltage threshold of the link structure; and
selectively applying a programming voltage to selected link structures to form conductive links through the selected link structures, the programming voltage being substantially less than the normal breakdown voltage threshold of the link structures without radiation.

16. A method of programming according to claim 15, wherein the programming voltage is about 6 volts or less.

17. A method of programming according to claim 15 wherein each link structure comprises conductive elements formed of aluminum.

18. A method of programming according to claim 15, wherein each link structure comprises a transformable insulator material comprising a silicon oxide layer and at least one silicon nitride layer.

19. A method of programming according to claim 15, wherein each link structure comprises a layer of amorphous silicon.

20. A method of programming according to claim 15, wherein each link structure comprises at least one silicon oxide layer of silicon-rich silicon oxide.

21. A method of programming according to claim 15, wherein a conductive element or each link structure is transparent and the electromagnetic radiation is light radiation.

22. A method of programming according to claim 15, wherein the emitted electromagnetic radiation is ultraviolet light.

23. A method of programming according to claim 1, wherein the emitted electromagnetic radiation has a radio wave frequency.

* * * * *